United States Patent [19]

Takahashi et al.

[11] Patent Number: 5,631,555
[45] Date of Patent: May 20, 1997

[54] VOLTAGE MEASUREMENT SYSTEM

[75] Inventors: Hironori Takahashi; Musubu Koishi; Akira Takeshima, all of Hamamatsu, Japan

[73] Assignee: Hamamatsu Photonics K.K., Hamamatsu, Japan

[21] Appl. No.: 535,669

[22] Filed: Sep. 28, 1995

[30] Foreign Application Priority Data

Sep. 29, 1994 [JP] Japan .................. 6-235162

[51] Int. Cl.$^6$ .................................. G01R 31/00
[52] U.S. Cl. .................................. 324/96
[58] Field of Search ................. 324/96; 350/276

[56] References Cited

U.S. PATENT DOCUMENTS

| | | | |
|---|---|---|---|
| 4,446,425 | 5/1984 | Valdmanis et al. | 324/77 |
| 4,618,819 | 10/1986 | Mourou et al. | 324/77 |
| 4,996,475 | 2/1991 | Takahashi et al. | 324/96 |
| 5,126,661 | 6/1992 | Harvey et al. | 324/158 |

FOREIGN PATENT DOCUMENTS

| | | |
|---|---|---|
| 0293841 | 12/1988 | European Pat. Off. . |
| 0430661 | 6/1991 | European Pat. Off. . |
| 0493906 | 7/1992 | European Pat. Off. . |
| 62-279732 | 12/1987 | Japan . |
| 4-307379 | 10/1992 | Japan . |
| 83/02829 | 8/1983 | WIPO . |

OTHER PUBLICATIONS

Aoshima et al, "Non–Contact Picosecond Electro–Optic Sampling With a Semiconductor Laser", T. IEEE, Japan, vol. 111–C, No. 4, 1991, pp. 145–154 (month unavailable).

Takahashi et al, "How The Electro–Optic Probing System can Contribute to LSI Testing", IMTC '94, May 10–12, Hamamatsu, pp. 1484–1491.

Kolner et al, "Electrooptic Sampling in GaAs Integrated Circuits", IEEE Journal of Quantum Electronics, vol. QE–22, No. 1, Jan. 1986, pp. 79–93.

Valdmanis et al, "Subpicosecond Electrooptic Sampling: Principles and Applications", IEEE Journal of Quantum Electronics, vol. QE–22, No. 1, Jan. 1986, pp. 69–78.

Primary Examiner—Kenneth A. Wieder
Assistant Examiner—Barry C. Bowser
Attorney, Agent, or Firm—Cushman Darby & Cushman, IP Group of Pillsbury Madison & Sutro, LLP

[57] ABSTRACT

An apparatus of this invention emits light onto an EO probe and detects the light reflected by the EO probe by using an MSM photodetector. The MSM photodetector is applied with a voltage of a frequency $nf_0 + \Delta f$.

12 Claims, 8 Drawing Sheets

APD

MSM

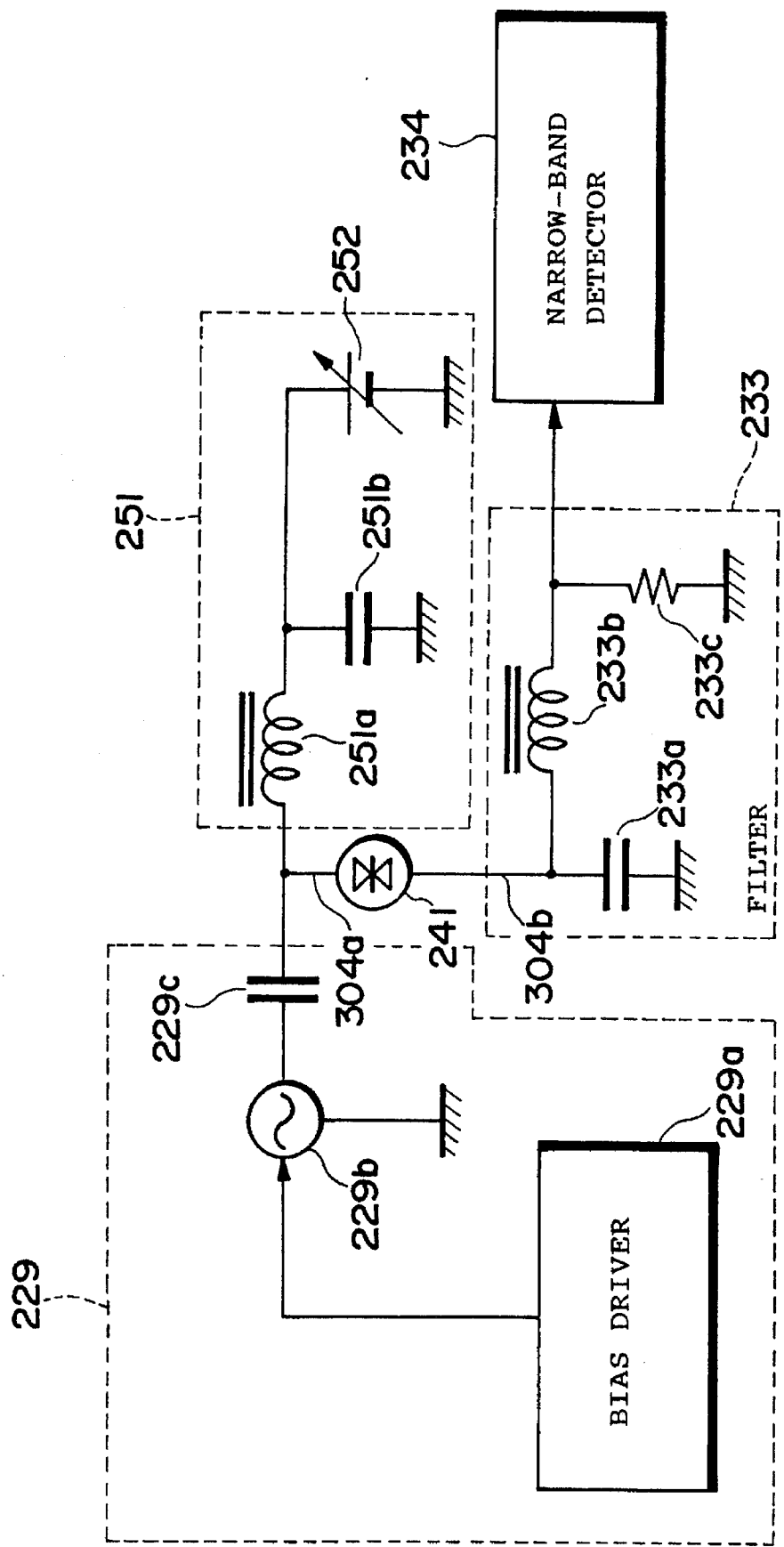

VOLTAGE MEASUREMENT SYSTEM

BACKGROUND OF THE INVENTION

1. Field of the Invention

The present invention relates to a voltage measurement system, and in particular an apparatus for measuring the voltage of an object by using an E-O probe made from an electro-optic material that changes its refractive index when applied with an electric field.

2. Related Background Art

Conventional voltage measurement apparatuses are described in U.S. Pat. Nos. 4,996,475, 4,446,425, and 4,618,819.

SUMMARY OF THE INVENTION

A system and apparatus of the present invention measures the voltage of a sample with a higher sensitivity than conventional EO apparatuses.

A system and apparatus of the present invention comprises a driver for applying a voltage signal of a frequency $f_0$ to a device to be measured, a probe arranged near the device and made from an electro-optic material, a photodetector for detecting light reflected by the probe, and a unit for applying a voltage of a frequency $nf_0+\Delta f$ to the photodetector. This photodetector is desirably an MSM photodetector.

The present invention will be more fully understood from the detailed description given hereinbelow and the accompanying drawings, which are given by way of illustration only and are not to be considered as limiting the present invention.

Further, the scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 6 is a block diagram showing a correction circuit for an MSM photodetector;

DESCRIPTION OF THE PREFERRED EMBODIMENTS

Figure 4:
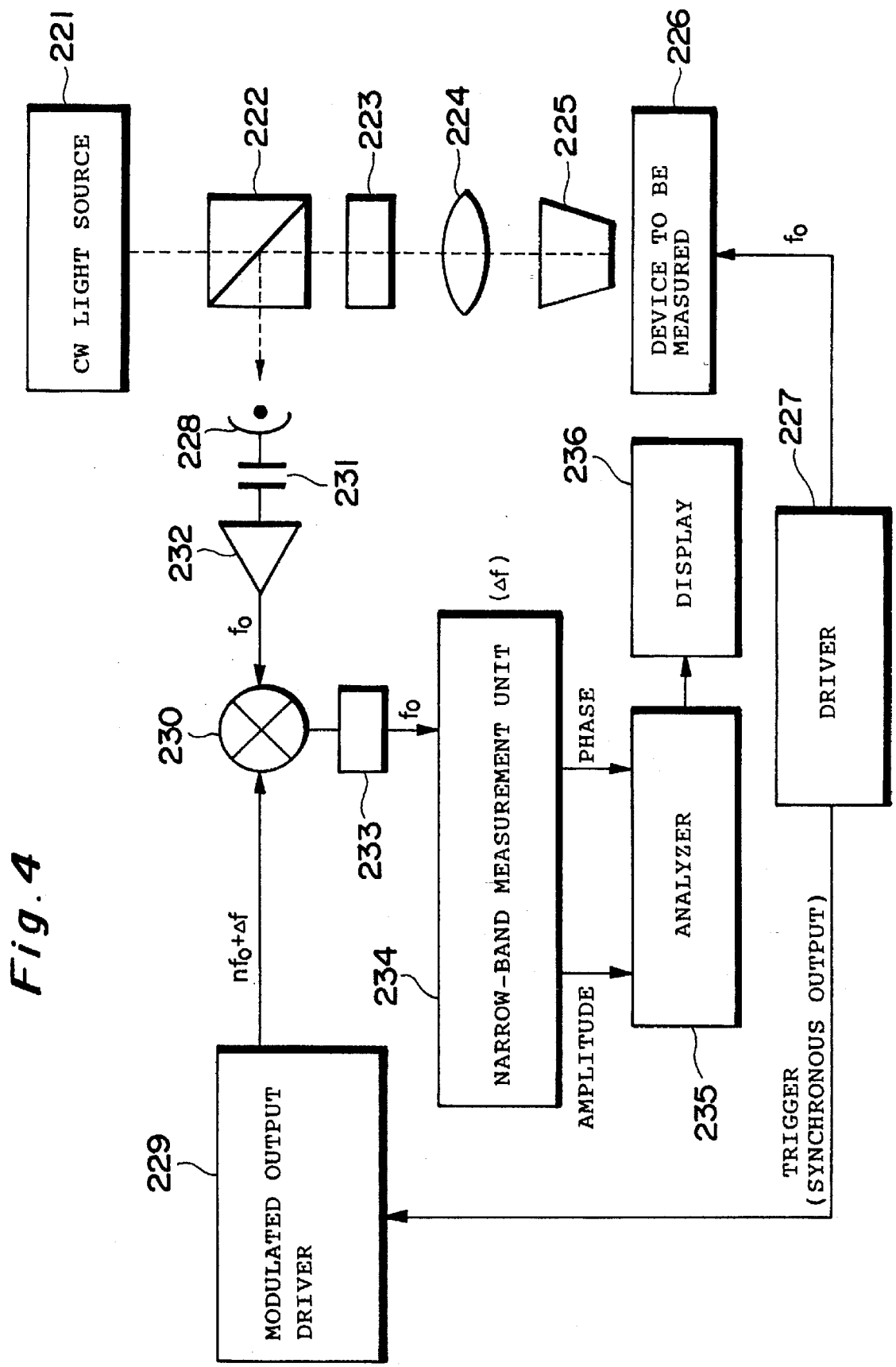
FIG. 4 is a block diagram showing the arrangement of a voltage measurement apparatus according to the first embodiment of the present invention.
Figure 5A:
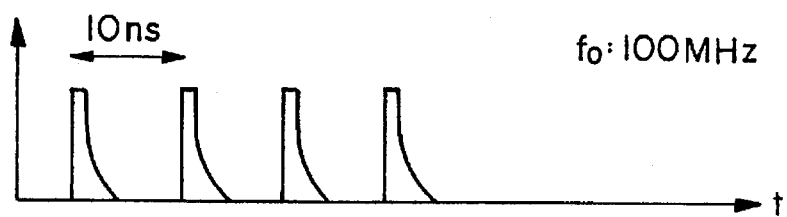
FIGS. 5A to 5F are graphs showing signals of individual parts of the voltage measurement apparatus according to the first embodiment.

FIG. 4 is a block diagram showing the arrangement of a voltage measurement apparatus according to the first embodiment of the present invention. FIGS. 5A to 5F are graphs showing the signal waveforms of individual parts of this apparatus. In the graph of FIG. 5A, the horizontal axis indicates time t and the vertical axis indicates the signal intensity. In the graphs of FIGS. 5B to 5F, the horizontal axis shows a frequency f and the vertical axis shows the signal intensity.

In this embodiment, a continuous wave (CW) light source 221 is used as a light source, and continuous light is emitted as measurement light. This continuous light is converted into linearly polarized light by a polarizing beam splitter (PBS) 222, given an optical bias by a wave plate 223, and focused on an E-O probe 225 by a focusing lens 224.

An electric field is applied to the E-O probe 225 from a device 226 to be measured. That is, the device 226 receives a driving signal from a driver 227 and produces an electrical signal to be measured having the time waveform shown in FIG. 5A. A repetition frequency $f_0$ of this electrical signal is 100 MHz, and the electrical signal is produced every 10 ns.

Figure 5B:
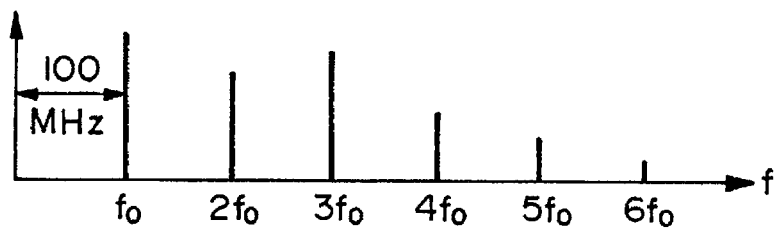

FIG. 5B illustrates the electrical signals to be measured on the frequency axis. In FIG. 5B, only components which are integral multiples of the repetition frequency $f_0$ (=100 MHz) are present. The electric field generated in the device 226 by the electrical signal is applied to the E-O probe 225.

The E-O probe 225 is made from an electro-optic material which changes its refractive index in accordance with the applied electric field. The electric field generated in the device 226 changes the polarized state of the measurement light which passes through the E-O probe 225. This change corresponds to the intensity of the applied electric field. The measurement light thus changed is reflected by a reflecting film (not shown) formed at the bottom tip of the E-O probe 225 and returns to the PBS 222 through the incident path. The PBS 222 converts the change of the polarized state into a change of the light intensity and outputs only polarized components perpendicular to the incident components to a high-speed photodetector 228.

The driver 227 outputs a trigger signal to a modulated output driver (unit) 229 in synchronism with the repetition frequency $f_0$. According to this trigger signal, the modulated output driver 229 generates a modulated frequency signal. The frequency of this modulated frequency signal is the sum frequency, $nf_0+\Delta f$, of an integral multiple $nf_0$ ($n$ is an integer) of the repetition frequency $f_0$ of the electrical signal to be measured and a measurement beat frequency $\Delta f$. As this measurement beat frequency $\Delta f$, a frequency much lower than the repetition frequency $f_0$ is used.

The modulated frequency signal $nf_0+\Delta f$ is applied to a frequency mixer 230. On the other hand, the signal detected by the high-speed photodetector 228 is input to a capacitor 231 where a DC component is removed from the signal to leave behind only an AC component. This AC component of the detected signal is amplified by a high-speed amplifier 232 and applied to the frequency mixer 230. Consequently, the frequency mixer 230 is applied with the modulated frequency signal $nf_0+\Delta f$ from the modulated output driver 229 and the detected signal from the high-speed amplifier 232. As described above, this detected signal contains signal components that are integral multiples of the repetition frequency $f_0$ of the electrical signal to be measured.

Figure 5C:
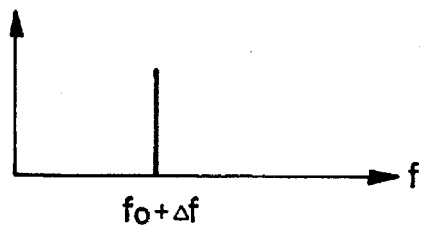
Figure 5D:

For example, if $n=1$ and the modulated output driver 229 outputs a modulated frequency signal $f_0+\Delta f$, FIG. 5C, this modulated frequency signal $f_0+\Delta f$ and the signal component with the frequency $f_0$ of the electrical signal are mixed. The frequency mixer 230 multiplies the two input signals and outputs signals having the sum and the difference frequencies of the two signal frequencies. A high-frequency cut filter 233 is provided at the output of the frequency mixer 230. Therefore, of the signals having the sum and the difference frequencies of the two signal frequencies, only a beat signal having the lower frequency, i.e., the difference frequency, $\Delta f$, FIG. 5D, is output.

Figure 5E:
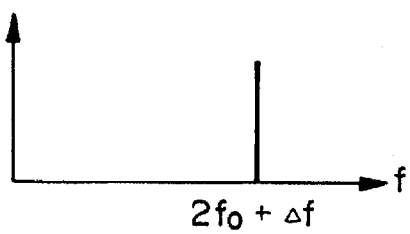
Figure 5F:
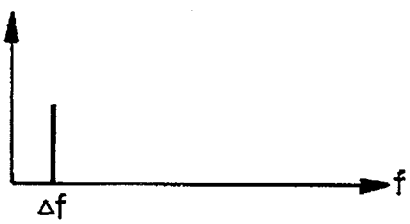

Also, if n=2 and the modulated output driver 229 outputs a modulated frequency signal $2f_0+\Delta f$, FIG. 5E, the frequency mixer 230 mixes this modulated frequency signal $2f_0+\Delta f$ and a second harmonic signal component with a frequency $2f_0$ of the electrical signal to be measured. The frequency mixer 230 outputs signals having the sum and the difference frequencies of these signal frequencies. The high-frequency cut filter 233 passes only a beat signal having the lower frequency, i.e., the difference beat frequency $\Delta f$, as illustrated in FIG. 5F.

In a similar fashion, a beat output with each nth harmonic signal component is extracted. These beat outputs are subjected to narrow-band detection done by a narrow-band measurement unit 234. That is, the narrow-band measurement unit 234 measures the amplitude and phase of the beat output with the fundamental repetition signal frequency $f_0$ and analogously measures the amplitude and phase of the beat output with the second harmonic signal component $2f_0$. Also, the narrow-band measurement unit 234 performs a narrow-band measurement for the beat output with the nth harmonic signal component $nf_0$.

The narrow-band measurement unit 234 with the above function is constituted by a network analyzer, a spectrum analyzer, or a lockin amplifier. Heterodyne measurement is used to produce a beat output having the difference frequency of two signals and perform narrow-band detection for this beat output as described above. The measurement results thus obtained are output to an analyzer 235.

The analyzer 235 performs Fourier transformation for these measurement results and obtains a signal time waveform. The obtained signal time waveform is displayed on a display 236. The voltage measurement apparatus of this first embodiment uses the CW light source 221 and the high-speed photodetector 228. The output from the high-speed photodetector 22B is input to the frequency mixer 230 and subjected to the heterodyne measurement.

The first embodiment with the above configuration achieves the following effects. That is, since the beat signal obtained by mixing is measured on the frequency axis, no high-speed oscilloscope is necessary as the measurement unit. Also, the CW light source 221, rather than a short-pulse light source, is used as the light source. This makes it unnecessary to generate short-pulse light having a distinct waveform free of tailing. According to this first embodiment, therefore, the voltage of the device 226 to be measured can be detected over a wide frequency band with a high sensitivity.

Figure 1A:
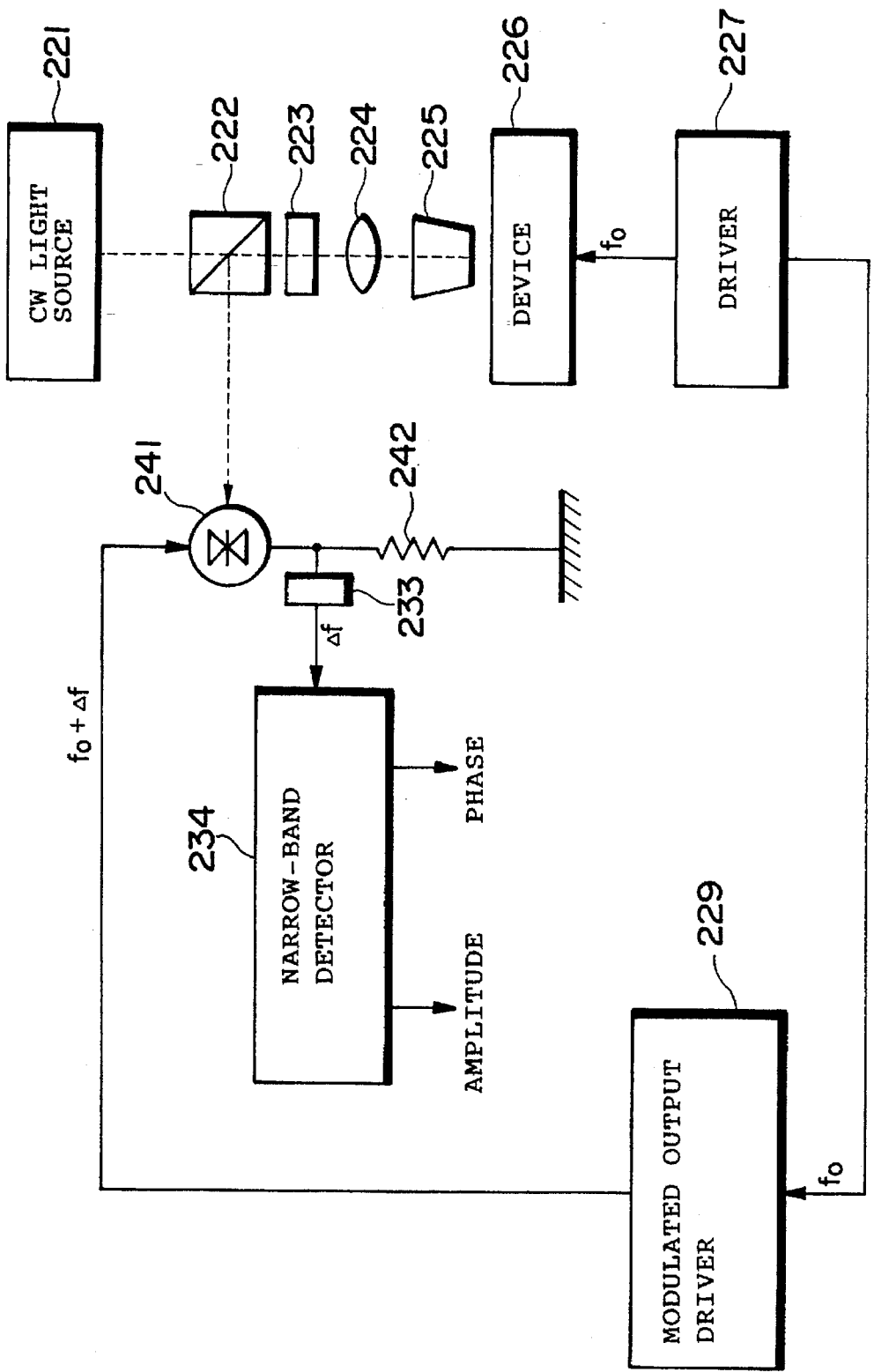
FIG. 1A is a block diagram showing the arrangement of a voltage measurement apparatus according to the second embodiment of the present invention.

A voltage measurement apparatus according to the second embodiment of the present invention will be described below. FIG. 1A is a block diagram showing the arrangement of the voltage measurement apparatus of this second embodiment. The same reference numerals as in FIG. 4 denote the same or corresponding parts in FIG. 1A, and a detailed description thereof will be omitted.

The difference between the voltage measurement apparatus of the second embodiment and the voltage measurement apparatus of the first embodiment lies in the arrangement of a unit for performing heterodyne measurement. That is, in the voltage measurement apparatus of the second embodiment, a photodetector for photoelectrically converting incident light in accordance with a bias voltage is used as a heterodyne measuring means.

As a photodetector of the above sort, this embodiment employs an MSM (Metal Semiconductor Metal) photodetector 241 which is a photoconductive type photodetector. This MSM photodetector 241 is capable of modulating the output or the gain by modulating the bias voltage. The MSM photodetector 241 has a series load resistor 242. Also, the MSM photodetector 241 is applied with an output modulated frequency signal from a modulated output driver 229, as the bias voltage.

As the incident light, measurement light whose intensity is changed in accordance with the applied electric field from a device 226 to be measured is used.

Figure 1C:
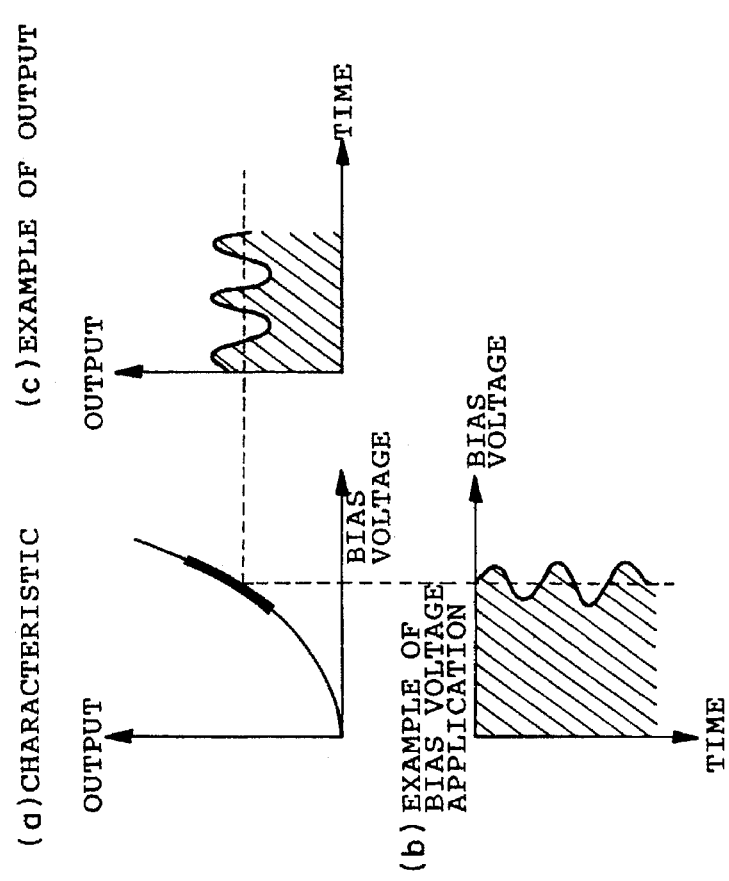
FIGS. 1B and 1C are graphs showing the characteristics of an MSM photodetector and an APD, respectively.
Figure 1B:
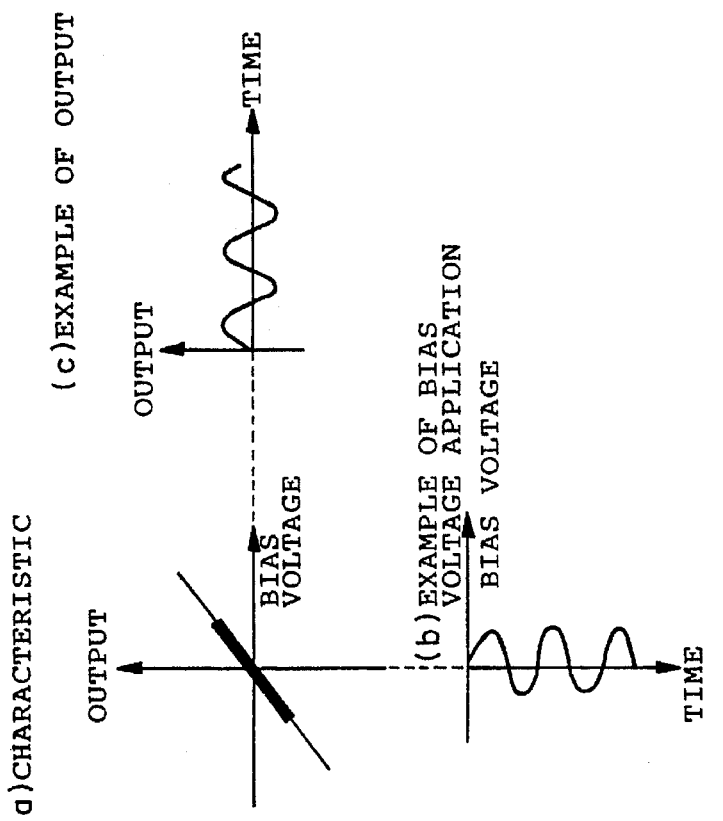

FIG. 1B shows the characteristics of the MSM photodetector 241. In FIG. 1B, graph (a) shows the characteristic that the output of the MSM photodetector 241 is directly proportional to the bias voltage when the incident light is constant. A thick straight-line portion in this graph represents the characteristic part used in this embodiment. The MSM photodetector 241 having this characteristic is applied with a bias voltage indicated by graph (b) of FIG. 1B, i.e., a modulated AC bias voltage which oscillates with time. The result is that a modulated output shown in graph (c) of FIG. 1B is obtained. That is, even if the quantity of light detected by the MSM photodetector 241 remains the same, by applying the AC bias voltage, it is possible to obtain an output directly proportional to the bias voltage.

This photodetector having the above function is not limited to a photoconductive photodetector such as the MSM photodetector. As an example, an APD (Avalanche Photo Diode) illustrated in FIG. 1C also can be used. In the case of the APD, as shown in graph (a) of FIG. 1C, there is a region (indicated by a thick line in graph (a)) in which the output from the ADP linearly changes with the bias voltage.

Accordingly, if in this region an AC bias voltage superposed on a DC bias, graph (b), is applied to the APD, a modulated output, graph (c), which is nearly proportional to this AC bias is attained. That is, even when the ADP is used as a photodetector and the detected light quantity remains unchanged, it is possible to obtain an output directly proportional to an AC bias by applying the AC bias by superposing it on a DC bias.

In this embodiment, a driver 227, FIG. 1A, supplies a driving signal to the device 226 to be measured, for example said driving signal is a sinusoidal electrical signal. The amplitude and phase of the electrical signal to be measured of the device are heterodyne-measured by using a modulated output. Assume that a repetition frequency $f_0$ of the driving signal is 100 MHz.

The modulated output at that time is an AC bias voltage which is applied from the modulated output driver 229 to the MSM photodetector 241 in synchronism with the device 226. This modulated output has a frequency $f_0+\Delta f$ which is the sum of the repetition frequency $f_0$ of the electrical signal to be measured and a detection beat frequency $\Delta f$. Assume the beat frequency $\Delta f$ is much lower than the repetition frequency $f_0$, e.g., a few Hz to a few KHz or MHz. The MSM photodetector 241 mixes the modulated light obtained by an E-O probe 225 and the modulated output $f_0+\Delta f$ supplied from the modulated output driver 229. The MSM photodetector 241 outputs signals having the sum frequency, $2f_0+\Delta f$, and the difference frequency, $\Delta f$, of these signal frequencies.

A high-frequency cut filter 233 is provided on the output side of the MSM photodetector 241. Consequently, of the output from the MSM photodetector 241 only the lowest-frequency component, i.e., a signal component having the beat frequency $\Delta f$ is extracted to form a beat output. The obtained beat output is measured by a narrow-band detector 234 such as a network analyzer, a spectrum analyzer, or a lock-in amplifier. By this measurement the amplitude and phase of the electrical signal to be measured of the device 226 are obtained.

The voltage measurement apparatus according to this second embodiment also achieves effects similar to those of the first embodiment mentioned previously. That is, since the beat signal obtained by mixing the two frequency signals by the MSM photodetector 241 is measured on the frequency axis, no high-speed oscilloscope is necessary as the measurement unit. Also, a continuous light source is used as the light source and this obviates the need for a short-pulse light source that is required in conventional systems. It is therefore unnecessary to generate short-pulse light having a distinct waveform free of tailing. The result is that this second embodiment also can detect the voltage of a device to be measured over a broad frequency band with a high sensitivity.

Figure 2:
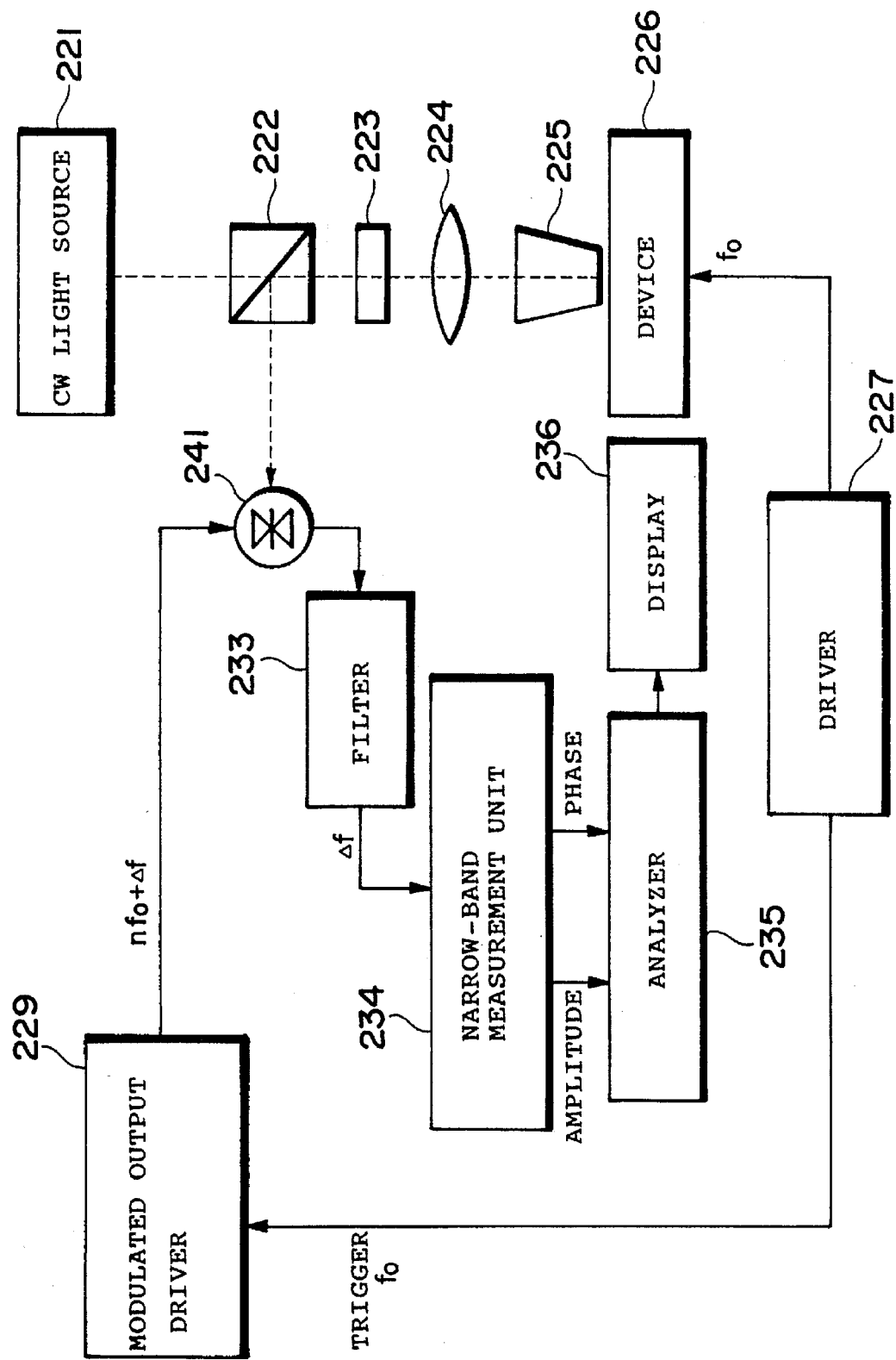
FIG. 2 is a block diagram showing the arrangement of a voltage measurement apparatus according to the third embodiment of the present invention.

A voltage measurement apparatus according to the third embodiment of the present invention will be described below. FIG. 2 is a block diagram showing the arrangement of the voltage measurement apparatus of this third embodiment. FIGS. 3A to 3G are graphs showing signals in individual parts of the apparatus. Note that the same reference numerals as in FIG. 1A denote the same or corresponding parts in FIG. 2, and a detailed description thereof will be omitted.

The voltage measurement apparatus of this third embodiment is a modified version of the voltage measurement apparatus of the second embodiment, and this voltage measurement apparatus is used to more precisely measure the waveform of an electrical signal to be measured. In this embodiment, the order, n, of the frequency of an output bias voltage from a modulated output driver 229 to an MSM photodetector 241 is changed such that n=1, 2, 3, 4, 5, ..., and beat signals of a frequency $\Delta f$ are sequentially subjected to heterodyne measurement.

Figure 3A:
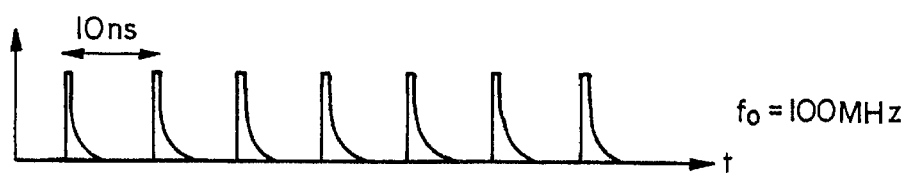
FIGS. 3A to 3G are graphs showing signals of individual parts of the voltage measurement apparatus according to the third embodiment.
Figure 3B:
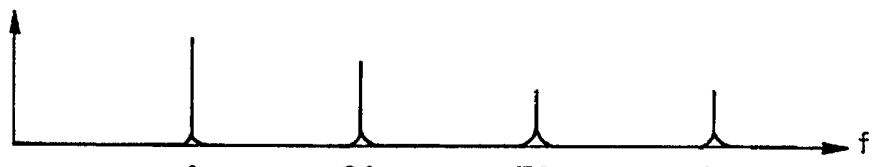

As an example, assume an electrical signal to be measured in a device 226 to be measured is represented on the time axis as illustrated in FIG. 3A. Assume also that a repetition frequency $f_0$ of this electrical signal is 100 MHz and the electrical signal is produced every 10 ns. The graph in FIG. 3B shows the frequency components of this electrical signal on the frequency axis. As in FIG. 3B, the electrical signal contains harmonic components $2f_0, 3f_0, \ldots$ of the repetition frequency $f_0$.

Figure 3C:
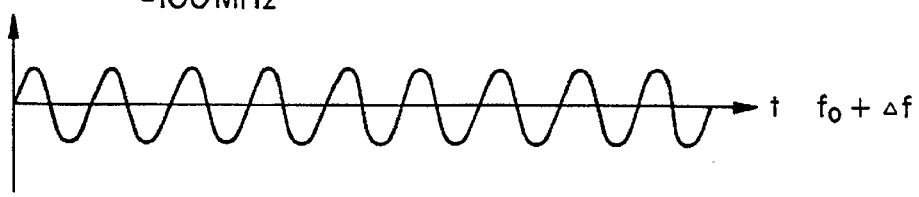
Figure 3D:
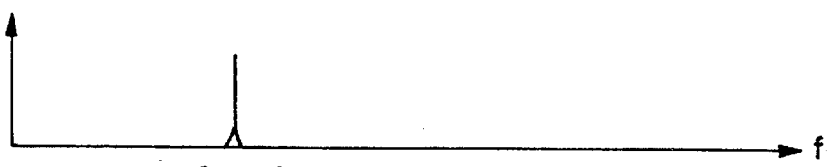
Figure 3E:
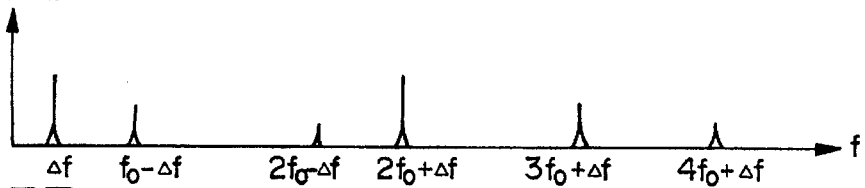

On the other hand, when n=1 the modulated output from the modulated output driver 229 is a sinusoidal wave with a frequency $f_0+\Delta f$ shown in the graph of FIG. 3C. Therefore, the modulated output has only the frequency component $f_0+\Delta f$ shown in the graph of FIG. 3D on the frequency axis. When light directly proportional to the electrical signal to be measured enters the MSM photodetector 241 and the modulated output is applied as a bias voltage to the MSM photodetector 241, the MSM photodetector 241 mixes these input signals and outputs a signal, the graph in FIG. 3E, containing a large number of frequency components.

This graph shows the frequency components on the frequency axis, and these frequency components correspond to the sum and the difference frequencies of the two input signals to the MSM photodetector 241. That is, the generated frequencies are the frequency component $2f_0+\Delta f$ and the beat frequency component $\Delta f$ which are the sum and the difference frequencies, respectively, of the modulated output $f_0+\Delta f$ and the repetition frequency $f_0$ of the electrical signal to be measured. Also, a frequency component $3f_0+\Delta f$ and a frequency component $f_0-\Delta f$ which are the sum and the difference frequencies, respectively, of the modulated output $f_0+\Delta f$ and the second harmonic component $2f_0$ of the electrical signal are generated.

Additionally, a frequency component $4f_0+\Delta f$ and a frequency component $2f_0-\Delta f$, which are the sum and the difference frequencies, respectively, of the modulated output $f_0+\Delta f$ and the third harmonic component $3f_0$ of the electrical signal, are generated. Analogously, frequency components that are the sum and the difference frequencies of the modulated output and the nth harmonic component of the electrical signal are generated. From these frequency component signals, a high-frequency cut filter 233 extracts only a beat output having the lowest frequency component, i.e., the beat frequency $\Delta f$, and outputs the beat signal to a narrow-band measurement unit 234. The narrow-band measurement unit 234 measures the amplitude and phase of the beat signal and outputs the measurement results to an analyzer 235.

Figure 3F:
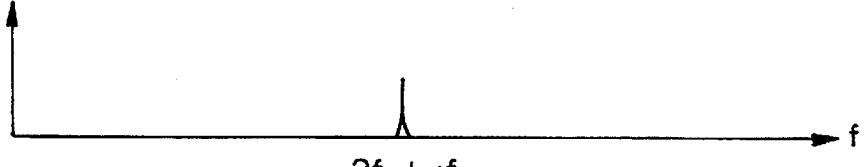

If n=2 and the modulated output driver 229 outputs the corresponding modulated frequency signal to the MSM photodetector 241, this modulated output contains only the frequency component $2f_0+\Delta f$, the graph in FIG. 3F, which is indicated on the frequency axis. This modulated output is applied as a bias voltage to the MSM photodetector 241, and light proportional to the electrical signal to be measured enters from a PBS 222 into the MSM photodetector 241. The MSM photodetector 241 mixes these signals.

Figure 3G:
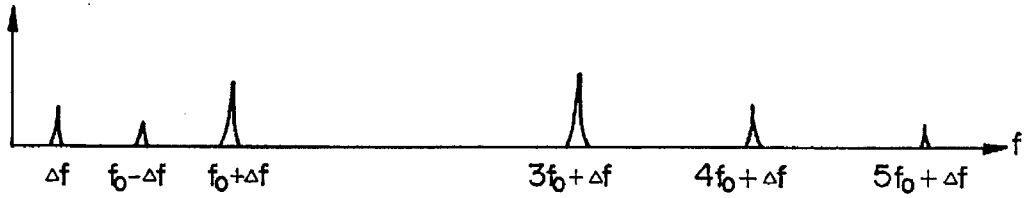

At this time, the amplitude and phase of the beat signal with the second harmonic component $2f_0$ of the electrical signal are heterodyne-measured, and a signal containing a large number of frequency components, FIG. 3G, is generated. That is, the frequency component $3f_0+\Delta f$ and the frequency component $f_0+\Delta f$, which are the sum and the difference frequencies, respectively, of the modulated output $2f_0+\Delta f$ and the repetition frequency $f_0$ of the electrical signal, are generated. Also, the frequency component $4f_0+\Delta f$ and the frequency component $\Delta f$, which are the sum and the difference frequencies, respectively, of the modulated output $2f_0+\Delta f$ and the second harmonic component $2f_0$ of the electrical signal, are generated. Additionally, a frequency component $5f_0+\Delta f$ and the frequency component $f_0-\Delta f$, which are the sum and the difference frequencies, respectively, of the modulated frequency $2f_0+\Delta f$ and the third harmonic component $3f_0$ of the electrical signal, are generated. Similarly, the sum and the difference frequency components of the modulated output and the nth harmonic component of the electrical signal to be measured are generated.

These frequency component signals also are applied to the high-frequency cut filter 233 where only a beat signal having the frequency $\Delta f$ is extracted. The extracted beat signal is output to the narrow-band measurement unit 234. The narrow-band measurement unit 234 measures the amplitude and phase of this beat signal and outputs the measurement results to the analyzer 235.

The heterodyne measurement as described above is similarly done for higher-order modulated outputs, and the results are delivered to the analyzer 235. The analyzer 235 performs Fourier transformation on the basis of these measurement results, calculates the waveform in the time domain from the measurement results in the frequency domain, and outputs the calculated waveform to a display 236. The display 236 displays this time waveform of the electrical signal to be measured.

The voltage measurement apparatus according to this third embodiment achieves effects analogous to those of the voltage measurement apparatuses of the first and second embodiments described previously. That is, according to the third embodiment it is no longer necessary to use a high-speed oscilloscope or a short-pulse light source. Consequently, this third embodiment also makes it possible to detect the voltage of a device to be measured over a wide frequency band with a high sensitivity.

In the second and third embodiments described above, if the MSM photodetector 241 has an asymmetrical output current characteristic with respect to a positive-negative symmetrical bias voltage, it is effective to provide a correction circuit 251, FIG. 6, in order to correct this asymmetry. Note that the same reference numerals as in FIGS. 1A and 2 denote the same or corresponding parts in FIG. 6, and a detailed description thereof will be omitted. That is, a DC voltage source 252 supplies a DC bias to the MSM photodetector 241, supplying a DC voltage for compensating for the asymmetry.

Figure 7A:
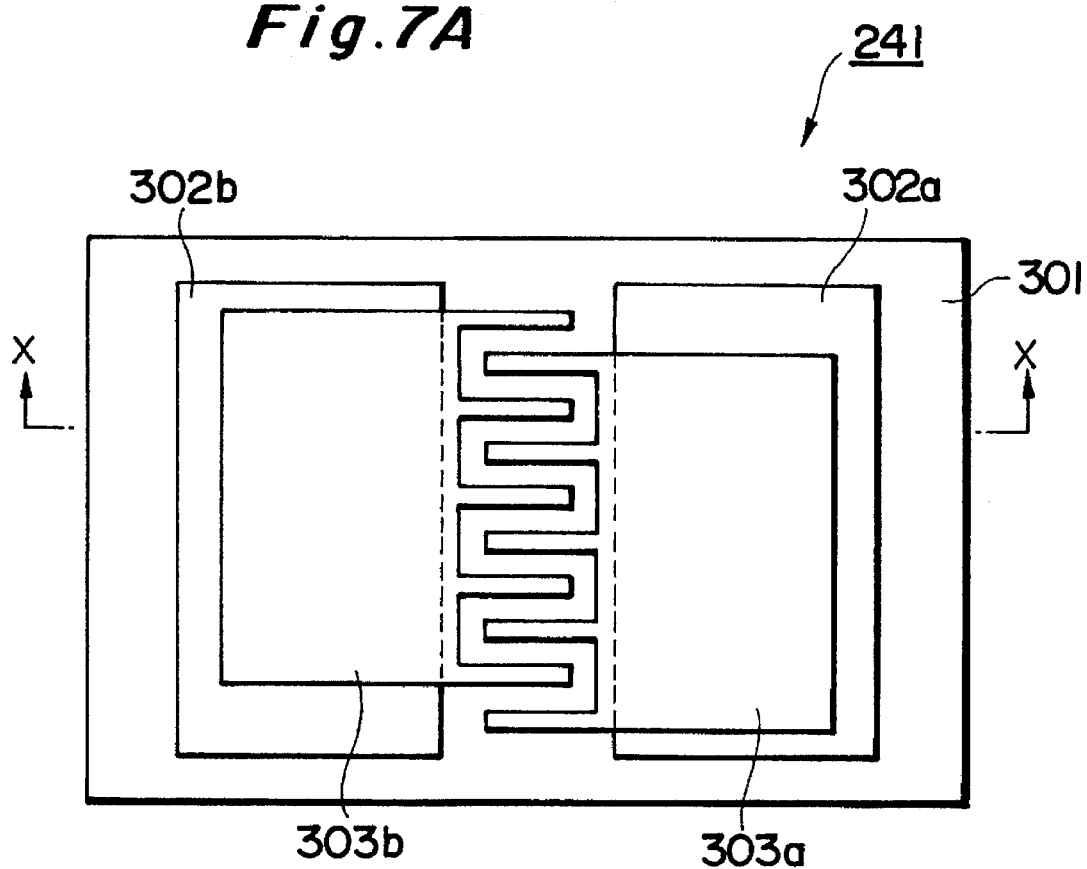
FIG. 7A is a plan view of an MSM photodetector.
Figure 7B:
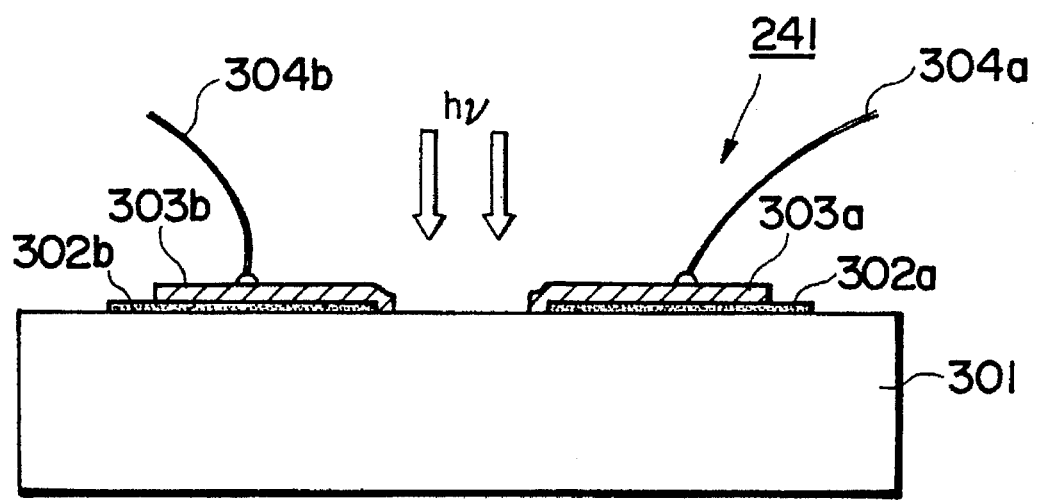
FIG. 7B is a sectional view of the MSM photodetector taken along the arrow X—X in FIG. 7A.

FIGS. 7A and 7B show the MSM photodetector 241. This photodetector 241 includes a compound semiconductor material 301, $SiO_2$ films 302a and 302b, and electrodes 303a and 303b. The substrate 301 is made from n-type GaAs. The substrate 301 and the electrodes are in Schottky-contact with each other. The electrodes 303a and 303b have an interdigital structure, and a gap is formed between them. Through this gap the light reflected by an E-O probe 225 is guided into the substrate 301.

Lead wires 304a and 304b are connected to the electrodes 303a and 303b, respectively, of the MSM 241. Through these lead wires 304a and 304b an AC voltage with a frequency $nf_0+\Delta f$ is applied to the photodetector 241.

The correction circuit includes a coil 251a connected to the first electrode 303a through the lead wire 304a, a capacitor 251b connected between the coil 251a and ground, and the DC power supply 252 connected between the coil 251a and ground.

The second electrode 303b is connected to a filter 233 through the lead wire 304b. The filter 233 consists of a capacitor 233a connected between ground and the lead wire 304b, a coil 233b connected to the lead wire 304b, and a resistor 233c connected between the coil 233b and ground.

A modulated output driver 229 includes an AC bias application unit 229b for applying an AC bias to the photodetector 241, a capacitor 229c connected between the unit 229b and the photodetector 241, and a bias driver 229a for applying a voltage to the AC bias application unit 229b. The AC bias application unit 229b is a voltage controlled oscillator (VCO) which changes the frequency of its output voltage in accordance with the input voltage. The bias driver 229a applies a desired voltage to the voltage controlled oscillator 229b.

When a narrow-band detector 234 performs heterodyne measurement for the amplitude and phase of an output beat signal from the MSM photodetector 241, an attenuation or a phase shift generally exists due to insertion of the detection circuit, and consequently a measurement error may occur. To correct this measurement error, a signal whose waveform is already known, e.g., a sine-wave signal, is previously measured to obtain a correction coefficient for the amplitude and phase of an output, and with this correction coefficient the obtained measurement result is corrected.

Also, to efficiently apply a frequency signal in the GHz band to the MSM photodetector 241, it is possible to integrate the MSM photodetector with a microwave strip electrode and apply an AC bias voltage to this electrode. If this AC bias voltage attenuates, it is only necessary to perform correction using the correction coefficient described above.

According to the present invention as has been described above, a continuous light source is used as the light source, so it is unnecessary to generate short-pulse light having a distinct waveform free of tailing. Also, since the beat signal is measured on the frequency axis, no high-speed oscilloscope is necessary as the measurement unit. This allows detection of a voltage over a broad frequency band with a high sensitivity.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 6-235162 (235162/1994) filed on Sep. 29, 1994, is hereby incorporated by reference.

What is claimed is:

1. A voltage measurement system comprising:
   (A) a probe adapted to be arranged near a device to be measured, said probe being comprised of an electro-optic material;
   (B) a photodetector for detecting light reflected by said probe; and
   (C) a unit for applying a voltage of a frequency $nf_0+\Delta f$ to said photodetector, where,
   $f_0$ is a frequency of a voltage signal to be applied to the device,
   n is an integer, and
   $\Delta f$ is a predetermined frequency.

2. A system according to claim 1, wherein said photodetector is a metal-semiconductor-metal photodetector.

3. A system according to claim 2, wherein said photodetector comprises:
   a GaAs substrate;
   a first electrode formed on said substrate; and
   a second electrode formed on said substrate, a gap being formed between said first and second electrodes.

4. A system according to claim 3, wherein said first and second electrodes have an interdigital structure.

5. A system according to claim 1, further comprising:
   a coil connected to said photodetector;
   a capacitor connected between said coil and ground; and
   a DC power supply connected between said coil and ground.

6. A system according to claim 3, further comprising:
   a coil connected to said first electrode;
   a capacitor connected between said coil and ground; and
   a DC power supply connected between said coil and ground.

7. A system according to claim 1, further comprising a filter connected to said photodetector.

8. A system according to claim 1, wherein an output signal from said photodetector has a beat signal at said frequency $\Delta f$.

9. A system according to claim 8, further comprising means for detecting an amplitude and phase of the beat signal.

10. A system according to claim 8, further comprising a narrow-band measurement unit for measuring an amplitude and phase of the beat signal.

11. A system according to claim 1, wherein an output from said photodetector depends on the voltage applied thereto.

12. A voltage measurement system comprising:

a probe adapted to be arranged near a device to be measured, said probe comprising an electro-optic material;

a photodetector for detecting light reflected by said probe and providing an output signal responsive thereto;

a mixer for receiving said output signal from said photodetector; and a unit for applying a voltage of a frequency $nf_0+\Delta f$ to said mixer, wherein $f_0$ is a frequency of a voltage signal to be applied to the device, n is an integer and $\Delta f$ is a predetermined frequency, said mixer outputting a signal indicative of a voltage of said device to be measured.

* * * * *